United States Patent [19]
McClure

[11] Patent Number: 5,483,489
[45] Date of Patent: Jan. 9, 1996

[54] MULTIPLEXING SENSE AMPLIFIER

[75] Inventor: David C. McClure, Carrollton, Tex.

[73] Assignee: SGS-Thomson Microelectronics, Inc., Carrollton, Tex.

[21] Appl. No.: 307,332

[22] Filed: Sep. 16, 1994

Related U.S. Application Data

[62] Division of Ser. No. 40,916, Mar. 31, 1993, Pat. No. 5,377,143.

[51] Int. Cl.⁶ ................................................. G11C 7/00
[52] U.S. Cl. .................. 365/189.11; 365/205; 365/196; 365/189.01; 365/189.02
[58] Field of Search ................ 365/189.01, 189.11, 365/189.02, 196, 205

[56] References Cited

U.S. PATENT DOCUMENTS

| | | | |
|---|---|---|---|
| 4,133,049 | 1/1979 | Shirato | 365/208 |
| 4,509,147 | 4/1985 | Tanimura et al. | 365/190 |
| 4,584,672 | 4/1986 | Schutz et al. | 365/203 |
| 4,634,900 | 1/1987 | Koshizuka | 307/530 |
| 4,754,433 | 6/1988 | Chin et al. | 365/189 |
| 4,811,297 | 3/1989 | Ogawa | 365/189 |
| 4,860,257 | 8/1989 | Choi | 365/189.11 |
| 4,907,201 | 3/1990 | Minami et al. | 365/207 |
| 4,910,713 | 3/1990 | Madden et al. | 365/189.11 |
| 4,972,374 | 11/1990 | Wang et al. | 365/189.11 |
| 4,984,204 | 1/1991 | Sato et al. | 365/189.11 |
| 4,984,206 | 1/1991 | Komatsu et al. | 365/208 |
| 5,151,879 | 9/1992 | Hsueh et al. | 365/190 |
| 5,159,684 | 10/1992 | Kroll et al. | 395/500 |
| 5,233,558 | 8/1993 | Fujii et al. | 365/189.01 |
| 5,241,503 | 8/1993 | Cheng | 365/205 |
| 5,241,504 | 8/1993 | Seevinck | 365/205 |
| 5,377,143 | 12/1994 | McClure | 365/189.11 |

Primary Examiner—Viet Q. Nguyen
Attorney, Agent, or Firm—Kenneth C. Hill; Lisa K. Jorgenson; Richard K. Robinson

[57] ABSTRACT

A memory system comprising a memory array having at least two pairs of data lines, first and second data lines corresponding to columns in the memory array. The memory array also includes two level shifter circuits, a first shifter circuit connected to the first lines and a second level shifter circuit connected to the second data lines, wherein the level shifter circuits produce output signals and may be enabled and disabled. A selection signal is used to selectively enable and disable the level shifter circuits, wherein one pair of data lines may be selected. An amplification circuit is connected to the level shifters for amplifying the output signals from the level shifter circuits, and a logic circuit is used to generate logic output signals in response to the amplified output signals from the amplification circuit.

15 Claims, 4 Drawing Sheets

MULTIPLEXING SENSE AMPLIFIER

This is a Division of application Ser. No. 08/040,916, filed Mar. 31, 1993 U.S. Pat. No. 5,377,143.

CROSS-REFERENCE TO RELATED APPLICATION

The present application is related to U.S. patent application Ser. No. 08/041,321, entitled "Multiplexing Sense Amplifier" filed of even date herewith by the inventor hereof, assigned to the assignee herein, and incorporated herein by reference.

BACKGROUND OF THE INVENTION

1. Field of the Invention

The present invention relates generally to the field of microelectronics and in particular to a method and apparatus for sensing signals from a memory array. Still more particularly, the present invention relates to a method and apparatus for selecting and sensing signals from a memory array.

2. Description of the Prior Art

Memories are devices that respond to operational orders, usually from a central processing unit (CPU) of a digital computer. A sense amplifier is typically employed to detect attenuated signals from a memory array. Two types of sense amplifiers are typically used: a static sense amplifier and a dynamic sense amplifier. Dynamic sense amplifiers are often used because they have low current consumption and the sense amplifiers are activated only when required to perform sensing functions.

Referring to FIG. 1, a memory array 100, a multiplexer 102, and a sense amplifier 104 are depicted in a configuration known to those skilled in the art. Memory array 100 contains a number of bit line pairs that may be accessed using word lines (not shown). Frequently in memory arrays, such as memory array 100, sense amplifier 104 is shared among many columns of the memory array. In addition, the data fed into sense amplifier 104 might be multiplexed between different blocks of columns within memory array 100. In the depicted example, left block 100a and right block 100b of memory array 100 share sense amplifier 104. Two pairs of data lines, LBT, LBC, RBT, and RBC originate from memory array 100 and are connected to multiplexer 102. Data lines LBT and LBC originate from left block 100a of memory in memory array 100; data lines RBT and RBC originate from right block 100b in memory array 100. Data lines LBT and LBC carry left block true and complement data signals respectively, while data lines RBT and RBC carry right block true and complement data signals respectively. Multiplexer 102 is used to select data from one pair of data lines and is connected to sense amplifier 104. Sense amplifier 104 may include a number of different stages.

Referring next to FIG. 2, sense amplifier 104 may include the following stages: level shifter 106, current mirror 108, and p-channel cross-coupled amplifier 110. A level shifter is typically employed to shift the voltage of the multiplexed signals in order to optimize the other stages of the sense amplifier. Typically, level shifter 106 is used to adjust the voltage of the signal selected by multiplexer 102 in order to optimize the performance of the other stages within sense amplifier 104. Sense amplifier 104 is employed to detect signals, in lines MUXC and MUXT, selected by multiplexer 102 from memory array 100. Typically, sense amplifier 104 includes p-channel cross-coupled amplifier 110 with a high common-mode rejection in order to reject picked-up interference due to cross-talk from other parts of the system.

With reference now to FIG. 3, a schematic diagram of a known multiplexer is illustrated. The multiplexer is constructed with transistors MA–MM. The transistors are p-channel metal-oxide semiconductor field effect transistors (MOSFETs). Multiplexer 102 is powered by connecting transistors ME, MG, MH, MI, MJ, and ML to power supply VCC. Points 111, 113, and 115 are points at which an equalization signal is applied to multiplexer 102.

Data from data line LBT is fed into the multiplexer 102 at input point 112; data from the data line LBC is fed into multiplexer 102 at input point 114; data from data line RBT is fed into multiplexer 102 at input point 116; and data from data line RBC is fed into multiplexer 102 at input point 118.

The selection between the right block signals and the left block signals are made utilizing transistors MA, MB, MC, and MD. These transistors are p-channel MOSFETs. A low select signal into input point 120, connected to the gates of transistors MA and MB, turns on transistors MA and MB causing the selection of signals from data lines LBT and LBC to be selected and sent out at output points 122 and 124, as true complement signals in data lines MUXT and MUXC respectively. A low select signal into input point 126, which is connected to the gates of transistors MC and MD, causes the true signal in data line RBT to be sent to sense amplifier 104 via output 122 connected to line MUXT and the complement signal from data line RBC to be sent to sense amplifier 104 via output point 124 connected to line MUXC. The use of multiplexer 102 typically causes a signal drop. It is desirable to have as much signal as possible for speed and reliability.

More information on semiconductor memories and sense amplifiers may be found in the following references: Prince, *Semiconductor Memories*, John Wiley and Sons (2nd Ed. 1991) and Haznedar, *Digital Microelectronics*, The Benjamin/Cummings Publishing Company, Inc. (1991).

Therefore, it would be desirable to have a method and apparatus for multiplexing and sensing a data signal from a memory array without diminishing the data signal being sensed.

SUMMARY OF THE INVENTION

The present invention provides a memory system, including a memory array having at least two pairs of data lines, first and second data lines corresponding to columns in the memory array. The memory array also includes two level shifter circuits, a first shifter circuit connected to the first lines and a second level shifter circuit connected to the second data lines, wherein the level shifter circuits produce output signals and may be enabled and disabled. A selection signal is used to selectively enable and disable the level shifter circuits, wherein one pair of data lines may be selected. An amplification circuit is connected to the level shifters for amplifying the output signals from the level shifter circuits, and a logic circuit is used to generate logic output signals in response to the amplified output signals from the amplification circuit.

The present invention also includes a multiplexing sense amplifier circuit for use with a memory array, which includes a level shifter stage having two level shifter circuits, a first level shifter circuit connected to a first input line and a first complement input line and a second level shifter circuit connected to a second input line and a second complement input line. Each level shifter circuit has two outputs, a true output and a complement output, and a select input. The level shifter circuits are responsive to a select signal, for enabling or disabling the level shifter circuit. The first level shifter circuit is disabled when the second level shifter circuit is enabled, and the first level shifter circuit is enabled when the second level shifter circuit is disabled, providing selection of signals from one of the two level shifter circuits.

The multiplexing sense amplifier circuit also has a second stage having a true output and a complement output, the second stage being connected to the true and complement outputs of the level shifter stage, wherein the true output and the complement output of the second stage is controlled by the outputs of the level shifter. An amplifier stage or logic circuit may be connected to the true output and the complement output of the second stage. The amplifier has a pair of outputs, wherein the amplifier generates logic 1 and logic 0 signals at the pair of outputs in the amplifier stage in response to signals from the true output and complement output of the second stage. Alternatively, the output of the second stage may be used without the amplifier or logic circuit.

The second stage of the multiplexing sense amplifier may include a pair of current mirrors. Other circuits that may be used in the second stage of the multiplexing sense amplifier include, for example, a p-channel cross-coupled amplifier, a differential amplifier, or a level shifter.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
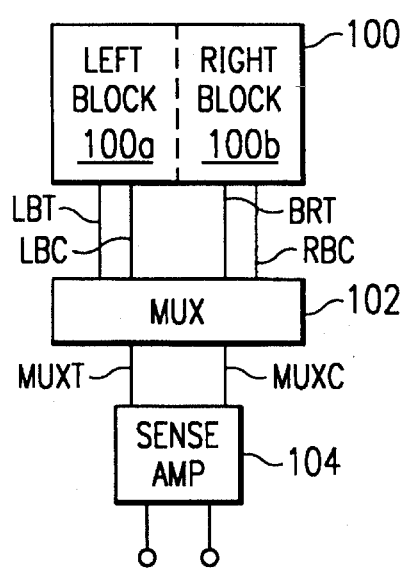
FIG. 1 is a block diagram of a portion of a memory system illustrating a configuration of a memory array, a multiplexer, and a sense amplifier known in the prior art.
Figure 2:
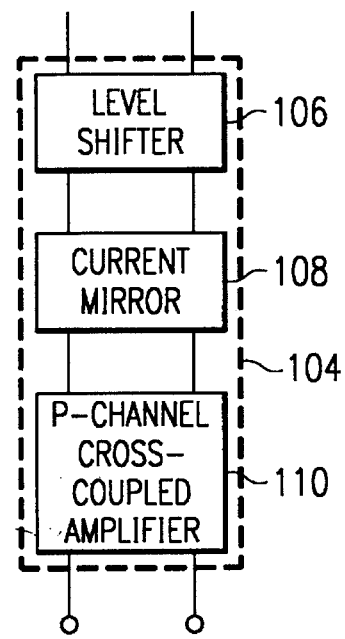
FIG. 2 is a block diagram of a sense amplifier known in the prior art.
Figure 3:
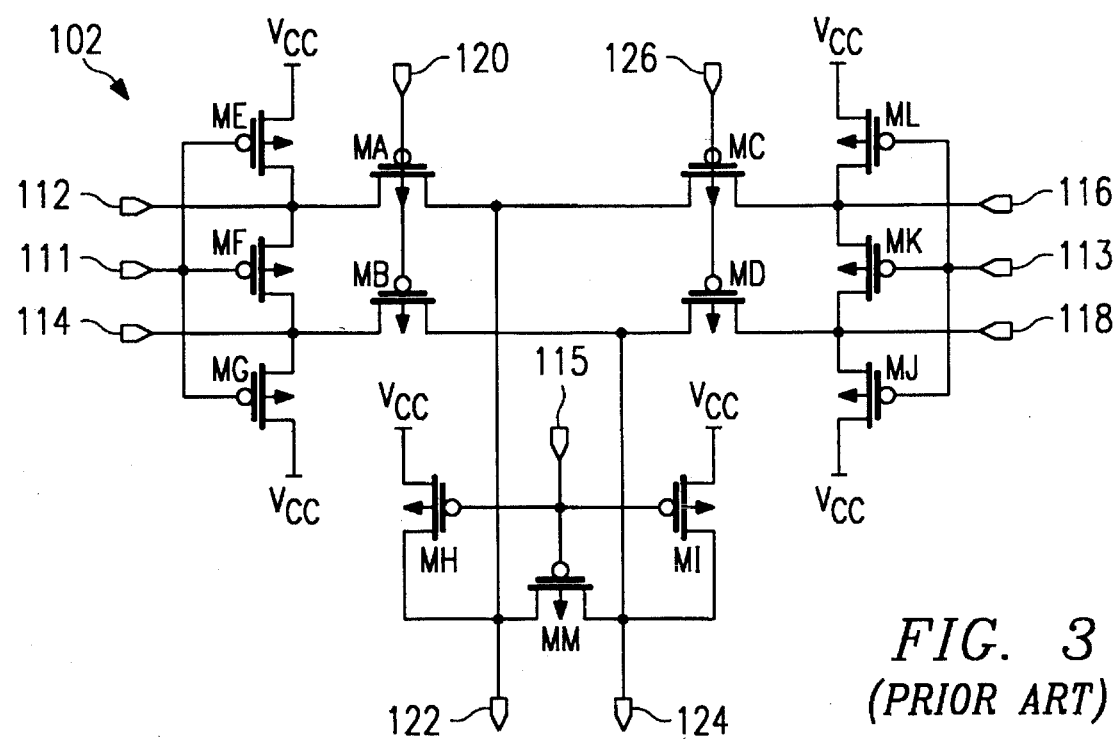
FIG. 3 is a schematic diagram of a multiplexer known in the prior art.

In accordance with a preferred embodiment of the present invention, the multiplexing function is incorporated into the sense amplifier in order to reduce the effects of having a separate multiplexer selecting signals as illustrated in the prior art design in FIG. 1.

Figure 4:
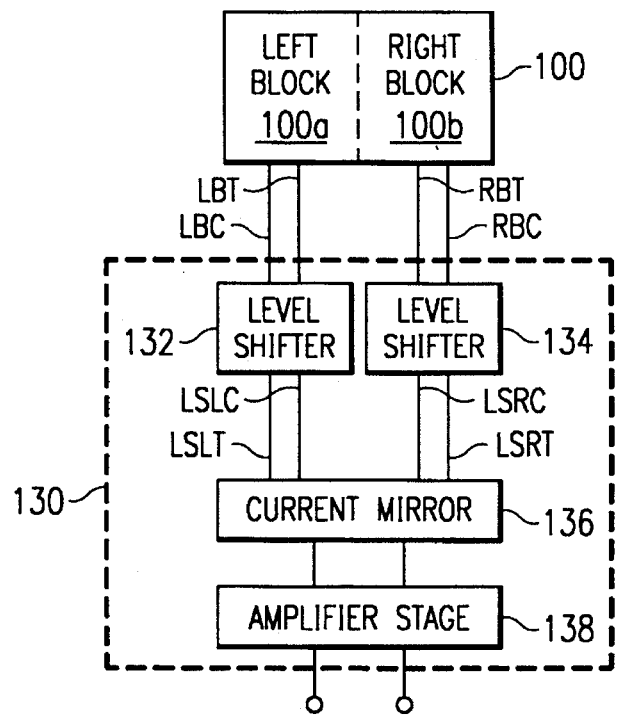
FIG. 4 is a block diagram of a portion of a memory system configured according to the present invention.

Referring now to FIG. 4, a block diagram of a portion of a memory system configured according to the present invention is illustrated. Memory array 100 again includes left block 100a and right block 100b. Signals from data lines LBT, LBC, RBC, and RBT are fed directly into sense amplifier 130 instead of a multiplexer. Signals from data lines LBT and RBT are true signals, while signals from data lines LBC and RBC are complement signals. In accordance with a preferred embodiment of the present invention, sense amplifier 130 includes level shifter 132, level shifter 134, current mirror stage 136, and amplifier stage 138. Multiplexing functions are incorporated into level shifters 132 and 134 in accordance with a preferred embodiment of the present invention.

Figure 5:
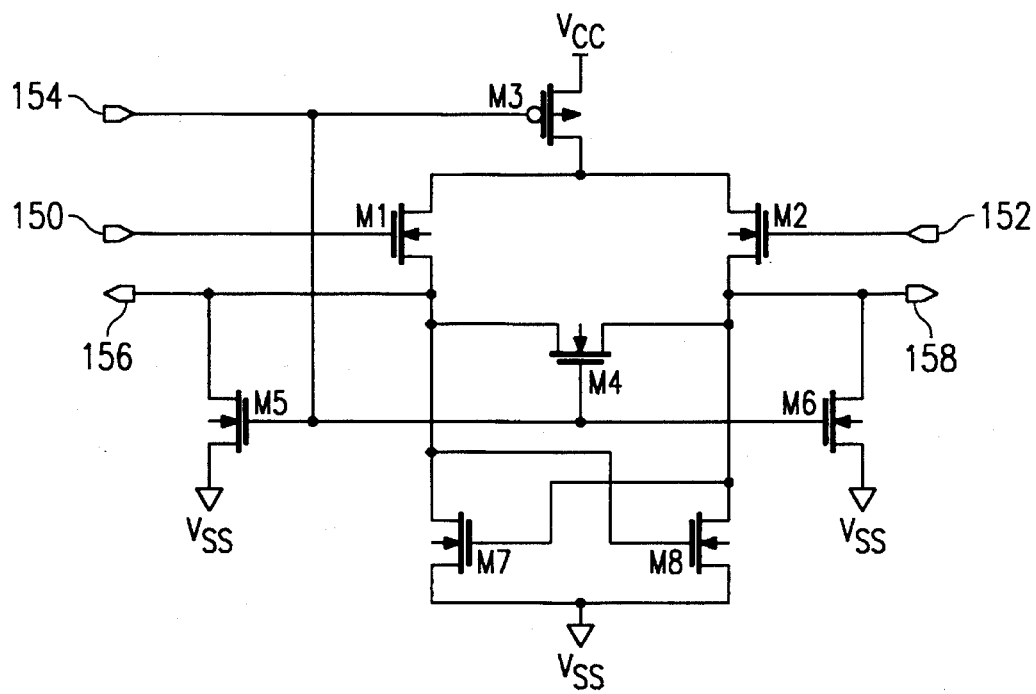
FIG. 5 is a schematic diagram of a cross-coupled level shifter according to the present invention.

Referring now to FIG. 5, a schematic diagram of a cross-coupled level shifter according to the present invention is depicted. Transistors M1–M8 comprise the cross-coupled level shifter. These transistors are n-channel and p-channel MOSFETs. Transistors M1, M2, M4–M8 are n-channel MOSFETs, and transistor M3 is a p-channel MOSFET in accordance with the preferred embodiment of the present invention. Input points 150 and 152 receive either signals from data lines LBT and LBC, or signals from data lines RBT and RBC, respectively. These signals control the gates of transistors M1 and M2 respectively. Transistors M7 and M8 are shown in a cross-coupled connection. Other configurations may be used, such as, tying the drain of each transistor, M7 and M8, to the transistor's own gate or by tying the gates to a bias voltage. The drain of transistor M3 is connected to power supply VCC, and the sources of transistors M5–M8 are connected to power supply VSS. These connections provide power to operate the circuit. Power supply VCC is at a higher voltage relative to power supply VSS.

The level shifter incorporates a multiplexing function in accordance with a preferred embodiment of the present invention. This multiplexing function is controlled by a select signal at input point 154 in level shifters 132 and 134. The select signal controls the gate of transistor M3. If the gate of transistor M3 is turned on, the level shifter allows the passage of the true and complement signals through output points 156 and 158 respectively. A high signal at input point 154 disables the level shifter, forcing the output at output points 156 and 158 to be low. On the other hand, when the signal at input point 154 is low, the level shifter performs normally in accordance with a preferred embodiment of the present invention.

By selecting only one of the two level shifters, 132 or 134, as depicted in FIG. 4, a 2 to 1 multiplexing of the signals from the memory array is achieved without diminishing signal strength in accordance with a preferred embodiment of the present invention. The output from output point 156 is a signal LSLT in level shifter 132 and a signal LSRT, right block true signal, in level shifter 134; the output from output point 158 is a signal LSLC, left block complement signal, in level shifter 132 and a signal LSRC, right block complement signal, in level shifter 134. In accordance with a preferred embodiment of the present invention, more than two level shifters may be used depending on the design of the memory system.

Figure 6:
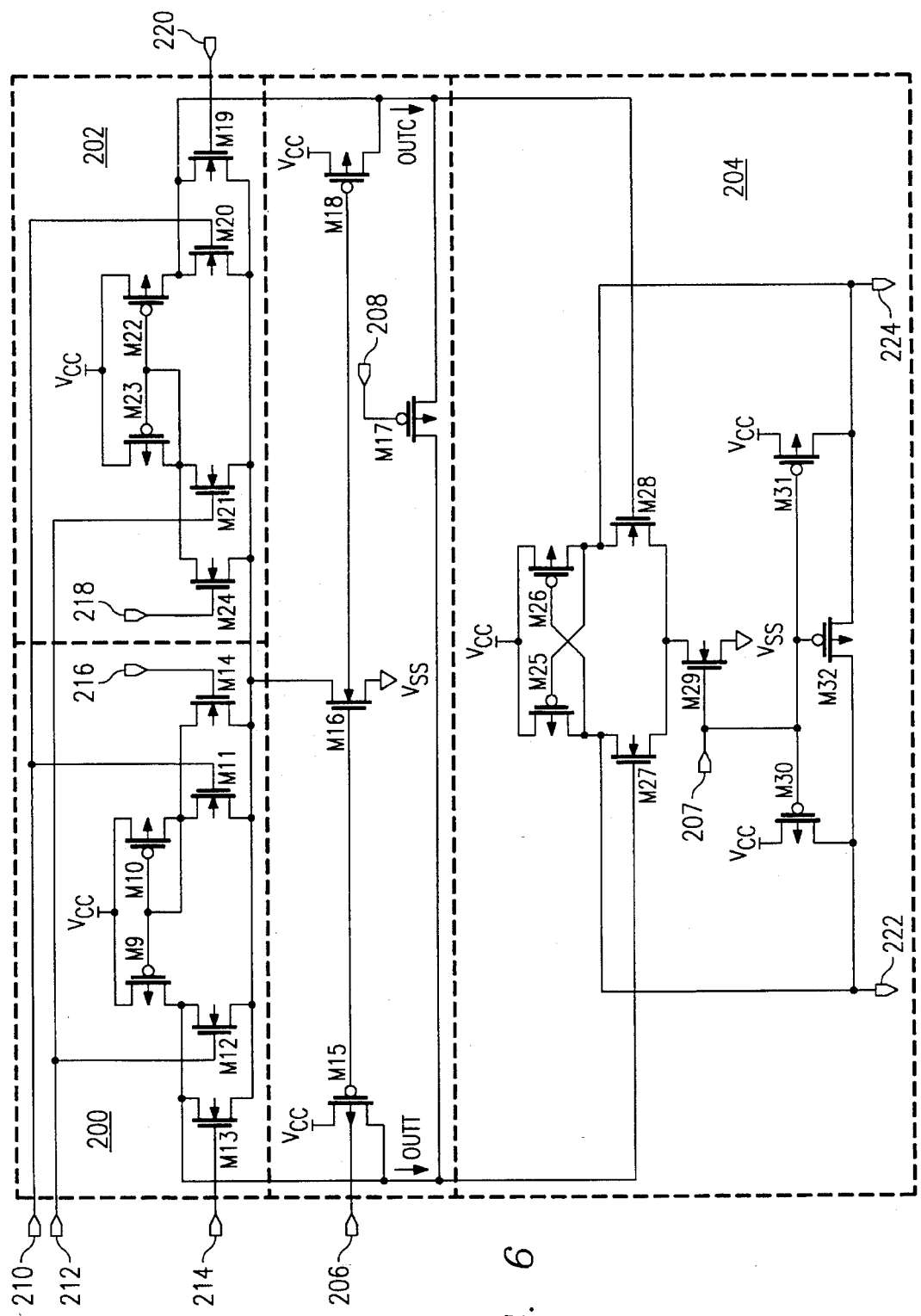
FIG. 6 is a schematic diagram of a pair of current mirrors and a p-channel cross-coupled amplifier according to the present invention.

Next, FIG. 6 illustrates a schematic diagram of a pair of current mirrors and a p-channel cross-coupled amplifier within a sense amplifier in accordance with a preferred embodiment of the present invention. Current mirror stage 136 includes current mirrors 200 and 202. Current mirror 200 is constructed from transistors M9–M4; current mirror 202 is constructed from transistors M19–M24. Transistors M9, M10, M22, and M23 are p-channel MOSFETs while the rest of the transistors in the two current mirrors are n-channel MOSFETs in accordance with the preferred embodiment of the present invention. P-channel cross-coupled amplifier 204 is constructed from transistors M25–M32. Transistors M25, M26, M30, M31, and M32, are p-channel transistors, while transistors M27, M28, and M29 are n-channel transistors in p-channel cross-coupled amplifier 204. Transistors M25–M28 form a flipflop in this circuit. Transistor M32 is employed to provide balancing within the circuit, and transistors M30 and M31 are utilized to pre-charge the circuit.

Transistors M15–M18 are employed to enable, disable, and pre-charge the sense amplifier in accordance with a preferred embodiment of the present invention. The current mirrors and the amplifier are powered by connecting the drains of transistors M9, M10, M15, M18, M22, M23, M25, M26, M30, and M31 to power supply VCC, while the sources of transistors M16, and M29 are connected to power supply VSS. Power supply VCC is typically at a higher voltage than power supply VSS.

Signals at input points 206, 207, and 208 enable and disable the circuits. Input points 210 and 212 carry signals LSRC and LSRT from level shifter 134 while input points 214 and 218 carry signal LSLC from level shifter 132. Input points 216 and 220 carry signal LSRT from level shifter 132. Signal LSRC controls the gates of transistors M11 and M20; signal LSRT controls the gates of transistors M12 and M21. Transistors M13 and M24 are controlled by signal LSLT; transistors M14 and M19 are controlled by signal LSLC.

In accordance with a preferred embodiment of the present invention, current mirrors 200 and 202 are current mirrors with additional transistors added in parallel to control the output of the current mirrors. Transistors M12 and M13 are connected in parallel; transistors M11 and M14 are in parallel; transistors M21 and M24 are connected in parallel; and transistors M20 and M19 are connected in parallel. These transistors control the current flow in the current mirrors.

If level shifter 134 is not selected and level shifter 132 has been selected, the signals at input points 210 and 212 are low. A low signal is a signal that turns the transistor off. As a result, transistors M11, M12, M20, and M21 are turned off. The signals at input points 214, 216, 218 and 220 correspond to the output from level shifter 132, resulting in various levels of current flowing through transistors M13, M14, M24, and M19 depending on the voltage at the gates of transistors by signals supplied by lines LSLT and LSLC. The output signals, OUTT and OUTC, from these two current mirrors control the gates of transistors M27 and M28 in p-channel cross-coupled amplifier 204 resulting in output signals DATAT and DATAC at output points 222 and 224 respectively. Signal DATAC is the complement of signal DATAT.

Figure 7:
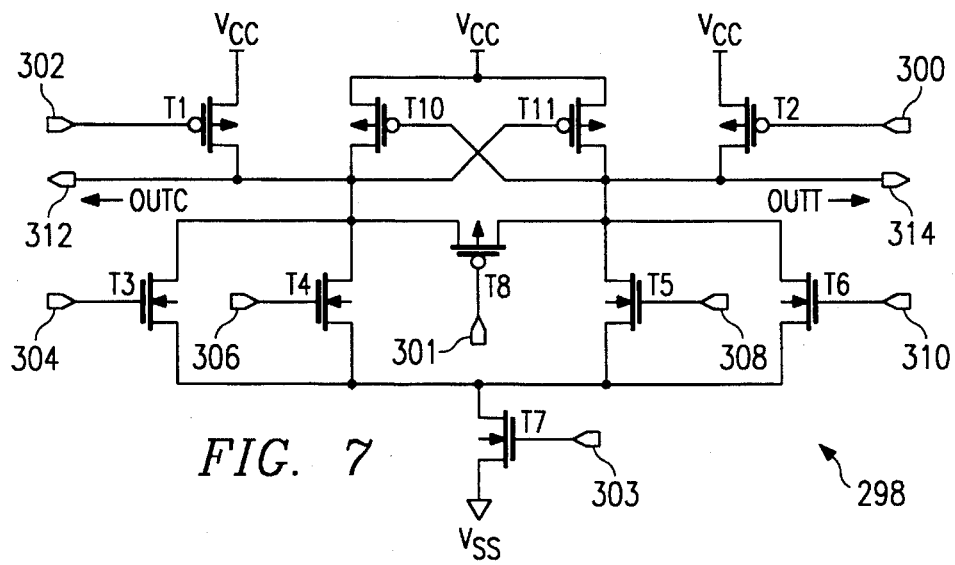
FIG. 7 is a schematic diagram of a p-channel cross-coupled amplifier according to the present invention.

Current mirror stage 136 in FIG. 4 may be replaced by a number of different stages in accordance with a preferred embodiment of the present invention. For example, a p-channel cross-coupled amplifier 298, as depicted in FIG. 7, may be utilized in place of the two current mirrors 200 and 202 illustrated in FIG. 6. P-channel cross-coupled amplifier 298 is constructed from transistors T1–T11. Transistors T1, T2, T8, T10, and T11 are p-channel MOSFETs. The remaining transistors are n-channel MOSFETs. P-channel cross-coupled amplifier 298 is powered by connecting transistors T1, T2, T10, and T11 to power supply VCC and connecting the drain of transistor T7 to power supply VSS.

P-channel cross-coupled amplifier 298 is enabled when a select signal is high at input points 300, 301, 302, and 303. These signals control the gates of transistors T1, T2, T7, and T8. Input points 304 and 306 are connected to the gates of transistors T3 and T4 respectively; input points 308 and 310 are connected to the gates of transistors T5 and T6 respectively. Again, a parallel configuration of transistor T3 in parallel with transistor T4 and transistor T5 in parallel with transistor T6 is employed in accordance with a preferred embodiment of the present invention. Signal LSLT enters input point 304; signal LSRT enters input point 306; signal LSRC enters input point 308; and signal LSLC enters input point 310. If level shifter 134 is disabled and level shifter 132 is selected, signals LSRT and LSRC will be low, causing transistors T4 and T5 to be turned off. Signals LSLT and LSLC will correspond to the output from level shifter 132, allowing various amounts of current to flow through transistors T3 and T6 in response to different voltages being applied to the gates of these two transistors in accordance with a preferred embodiment of the present invention.

Transistors T10 and T11 are the cross-coupled p-channel MOSFETs within the amplifier. Signal OUTC travels from output point 312 to transistor M28 in amplifier 204 in FIG. 6. Signal OUTT travels from output point 314 to transistor M27 in amplifier 204 in FIG. 6. The depicted embodiment in FIG. 6 illustrates employing an amplifier connected to the current mirrors to produce a logic signal. According to the present invention, some other logic circuit may be used in place of amplifier 204. Furthermore, the circuit below current mirrors 200 and 202 may be eliminated, and the output from current mirrors 200 and 202 may be directly used as the output of the sense amplifier.

Figure 8:
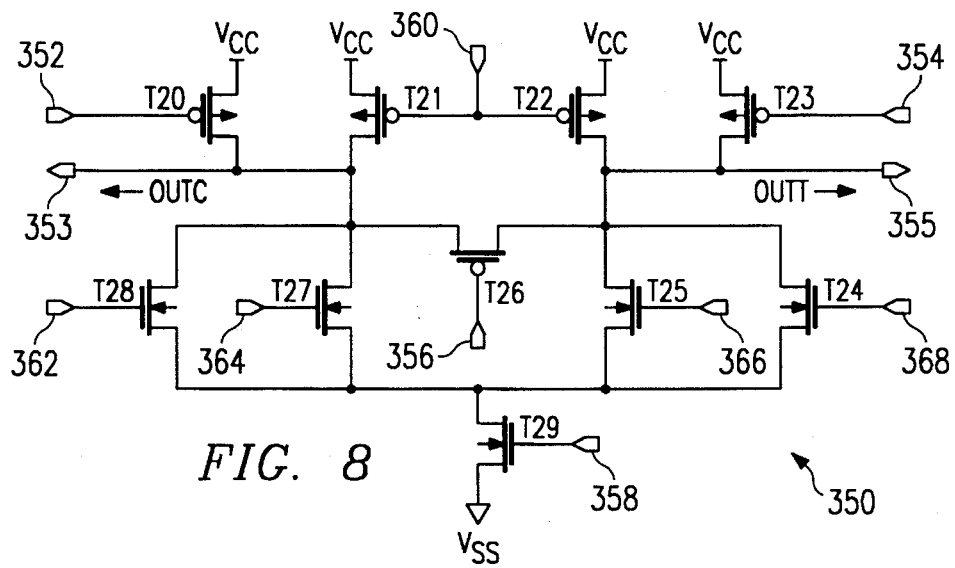
FIG. 8 is a schematic diagram of a differential amplifier according to the present invention.

Referring now to FIG. 8, a schematic diagram of a differential amplifier, which may be substituted in place of current mirrors 200 and 202 in FIG. 6, is illustrated in accordance with a preferred embodiment of the present invention. Differential amplifier 350 is comprised of transistors T20–T29. Transistors T20–T23 and T26 are p-channel MOSFETs while the remaining transistors are n-channel MOSFETs. This circuit is powered by connecting the drains of transistors T20, T21, T22, and T23 to power supply VCC and connecting the source of transistor T29 to power supply VSS.

Transistors T20, T23, T26 and T29 enable and disable differential amplifier 350. These transistors are controlled by control signals at input points 352, 354, 356, and 358. A bias signal (or ground) is applied to the amplifier at input point 360, which controls the gates of transistors T21 and T22. Transistor T28 is controlled by signal LSLT at input point 362. Transistor T27 is controlled by signal LSRT at input point 364. Transistor T25 is controlled by signal LSRC at input point 366. Transistor T24 is controlled by signal LSLC at input point 368. Output point 353 is connected to the gate of transistor M28 in amplifier 204 and provides a complement output signal OUTC, while output point 355 is connected to the gate of transistor M27 in amplifier 204 and provides an output signal, OUTT.

Figure 9:
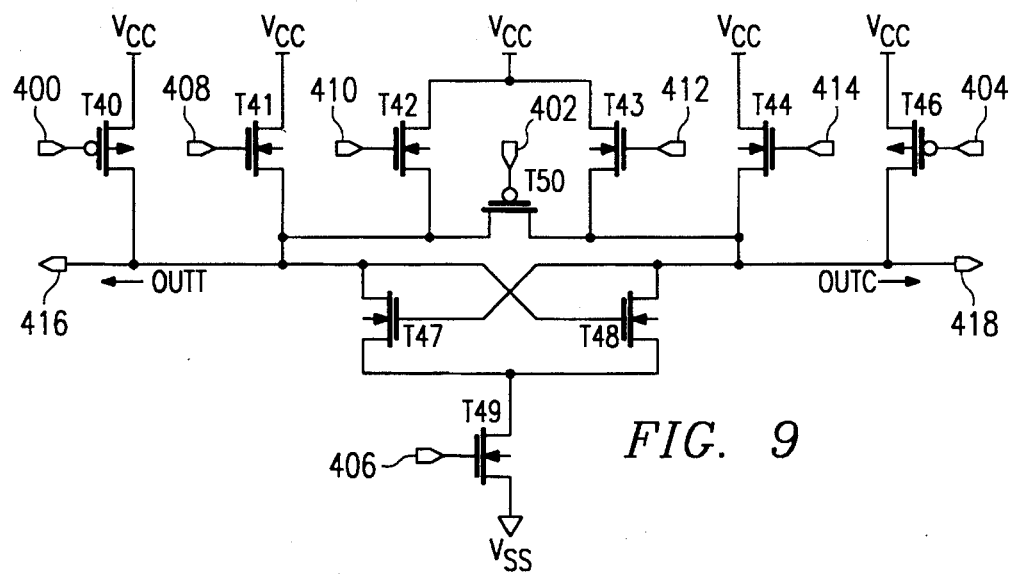
FIG. 9 is a schematic diagram of a level shift according to the present invention.

Referring now to FIG. 9, transistors T40–T50 are utilized to form a level shifter that may be utilized in place of current mirrors 200 and 202 in FIG. 6. Transistors T40, T46, and T50 are p-channel MOSFETs, while transistors T41, T42, T43, T44, T47, T48, and T49 are n-channel MOSFETs in accordance with a preferred embodiment of the present invention. Transistors T40, T46, T49, and T50 are employed to enable and disable the circuit. Control signals at input points 400, 402, 404, and 406 control the gates of these transistors. The circuit is powered by connecting the drains of transistors T40, T41, T44, and T46 to power supply VCC, while connecting the source of transistor T49 to power supply VSS.

Transistor T41 is controlled by signal LSLT applied to input point 408. Transistor T42 is controlled by signal LSRT applied to input point 410; transistor T43 is controlled by signal LSRC applied to input point 412; and transistor T44 is controlled by signal LSLC applied to input point 414. Transistors T41 and T42 are in parallel; transistors T43 and T44 are in parallel. Output point 416 is connected to the gate of transistor M27 in amplifier 204 in FIG. 6. Output point 418 is connected to the gate of transistor M28 in amplifier 204 is FIG. 6. The output signals at output points 416 and 418 are determined by the input signals at input points 408, 410, 412, and 414. For example, if level shifter 134 is disabled and level shifter 132 is selected, transistors T41 and T44 would be turned on, while transistors T42 and T43 would be turned off. The output at output point 416 would depend on signal LSLT at input point 408, which controls transistor T41. The output at output point 418 would depend on signal LSLC at input point 414, controlling transistor T44.

The present invention allows for selection of signals by enabling and disabling a pair of level shifters, instead of using a separate multiplexer. Transistors controlling the output in later stages are placed in parallel and controlled by the output signals from the level shifters. Although, two level shifters are depicted, other numbers of level shifters may be utilized in different memory array configurations. Although the depicted embodiment illustrates the selection of signals by enabling and disabling a pair of level shifters, other circuits other than level shifters may be manipulated in a similar function within a sense amplifier to provide selection of signals.

In addition, the depicted embodiment illustrates an implementation involving pairs of data lines, carrying true and complement signals. Those of ordinary skill in the art will appreciate that a single data line implementation, instead of a pair of data lines, may be employed according to the present invention. A differential amplifier may be used to produce a true and complement signal from a single data line.

One advantage of the present invention is that it provides a faster and more sensitive sense amplifier because signal losses resulting from signals propagating through a transmission gate in a multiplexer stage are eliminated. Additionally, the present invention provides for smaller and simpler circuitry for selecting and sensing signals from data lines in multiple blocks of memory. The present invention is depicted using MOS technology. Other types of technology and transistors may be utilized in accordance with a preferred embodiment of the present invention.

While the invention has been particularly shown and described with reference to a preferred embodiment, it will be understood by those skilled in the art that various changes in form and detail may be made therein without departing from the spirit and scope of the invention.

What is claimed is:

1. A memory system comprising:
    a memory array having at least two pairs of data lines, first and second data lines corresponding to columns in the
    at least two level shifter circuits, a first shifter circuit connected to the first data lines and a second level shifter circuit connected to the second data lines, wherein the at least two level shifter circuits produce output signals and may be enabled and disabled;
    a selection signal for selectively enabling and disabling the at least two level shifter circuits, wherein one pair of data lines may be selected; and
    an amplification circuit connect to the at least two level shifter circuits for amplifying the output signals from the at least two level shifter circuits.

2. The memory system of claim 1 further comprising:
    a logic circuit for generating logic output signals in response to the amplified output signals from the amplification circuit.

3. The memory system of claim 2, wherein the logic circuit comprises a flip-flop circuit.

4. The memory system of claim 2, wherein the logic circuit comprises a p-channel cross-coupled metal-oxide semiconductor field effect amplifier.

5. The memory system of claim 1, wherein the amplification circuit comprises two current mirrors.

6. The memory system of claim 1, wherein the amplification circuit comprises a p-channel cross-coupled amplifier.

7. The memory system of claim 1, wherein the amplification circuit comprises a differential amplifier.

8. The memory system of claim 1, wherein the amplification circuit comprises a level shifter.

9. A memory system comprising:
    a memory array having at least two pairs of data lines, first and second data lines corresponding to columns in the memory array;
    at least two level shifter circuits, a first level shifter circuit connected to the first data lines and a second level shifter circuit connected to the second data lines, wherein the at least two level shifter circuits produce output signals and may be selectively enabled and disabled such that only one of the at least two level shifter circuits are enabled;
    a selection signal for selectively enabling and disabling the at least two level shifter circuits, wherein one of the level shifter circuits is enabled while remaining level shifter circuits are disabled such that one pair of the at least two pair of data lines are selected; and
    an amplification circuit connected to the at least two level shifter circuits for amplifying the output signals from the at least two level shifter circuits.

10. The memory system of claim 1, further comprising:
    a logic circuit for generating logic output signals in response to the amplified output signals from the amplification circuit.

11. The memory system of claim 10, wherein the logic circuit comprises a flip-flop circuit.

12. The memory system of claim 10, wherein the amplification circuit comprises two current mirrors.

13. The memory system of claim 10, wherein the amplification circuit comprises a p-channel cross-coupled amplifier.

14. The memory system of claim 10, wherein the amplification circuit comprises a differential amplifier.

15. The memory system of claim 10, wherein the amplification circuit comprises a level shifter.

\* \* \* \* \*

UNITED STATES PATENT AND TRADEMARK OFFICE
CERTIFICATE OF CORRECTION

PATENT NO. : 5,483,489
DATED : January 9, 1996
INVENTOR(S) : David C. McClure

It is certified that error appears in the above-indentified patent and that said Letters Patent is hereby corrected as shown below:

In claim 10, column 8, line 48, after "claim" delete "1" and insert --9--.

Signed and Sealed this

Nineteenth Day of November, 1996

Attest:

BRUCE LEHMAN

*Attesting Officer*     *Commissioner of Patents and Trademarks*